United States Patent [19]

Lopez de Romaña

[11] Patent Number: 4,465,977

[45] Date of Patent: Aug. 14, 1984

[54] ERRONEOUS PULSE SEQUENCE DETECTOR

[75] Inventor: Eduardo A. Lopez de Romaña, Torrance, Calif.

[73] Assignee: Discovision Associates, Costa Mesa, Calif.

[21] Appl. No.: 385,171

[22] Filed: Jun. 4, 1982

[51] Int. Cl.³ .............................................. H03K 5/19
[52] U.S. Cl. .................................. 328/120; 328/133; 377/69
[58] Field of Search ...................... 328/120, 111, 133; 307/234, 514; 377/69

[56] References Cited

U.S. PATENT DOCUMENTS

| | | | |
|---|---|---|---|
| 3,735,271 | 5/1973 | Leibowitz | 307/234 |
| 4,378,509 | 3/1983 | Hatchett et al. | 328/133 |
| 4,399,412 | 8/1983 | Rinaldi | 328/120 |
| 4,427,948 | 1/1984 | Rinaldi | 328/120 |
| 4,439,729 | 3/1984 | Claussen | 328/133 |

Primary Examiner—John S. Heyman
Assistant Examiner—Timothy P. Callahan
Attorney, Agent, or Firm—Ronald J. Clark

[57] ABSTRACT

A drop-out detector for detecting the absence of a pulse in either of first and second pulse trains, especially for use with the spindle servo error generator of a videodisc mastering machine. Prior attempts at providing a drop-out detector function for the spindle servo error generator rely on the use of RC based timing circuits to create time windows within which to look for the presence or absence of a reference or tach pulse, as the case may be. Such arrangements provide satisfactory performance in connection with constant angular velocity type discs, since reference and tach frequencies remain constant throughout the mastering process. However, problems arise in utilizing such RC based circuits in connection with constant linear velocity type discs. The present invention overcomes these problems by operating on a pulse width modulation technique for controlling the spindle motor speed. In such an arrangement, rather than to phase compare two AC signals, one from the reference oscillator and one from the tachometer, a three-stage shift register is provided whose output is pulse width modulated by the difference in time relationship between two pulse train inputs, one pulse train representing a reference standard and the other representing the tachometer output. A detector indicates when the states of the first and third stages of the shift register are the same which signifies an improper relationship between the tachometer pulses and reference pulses.

8 Claims, 5 Drawing Figures

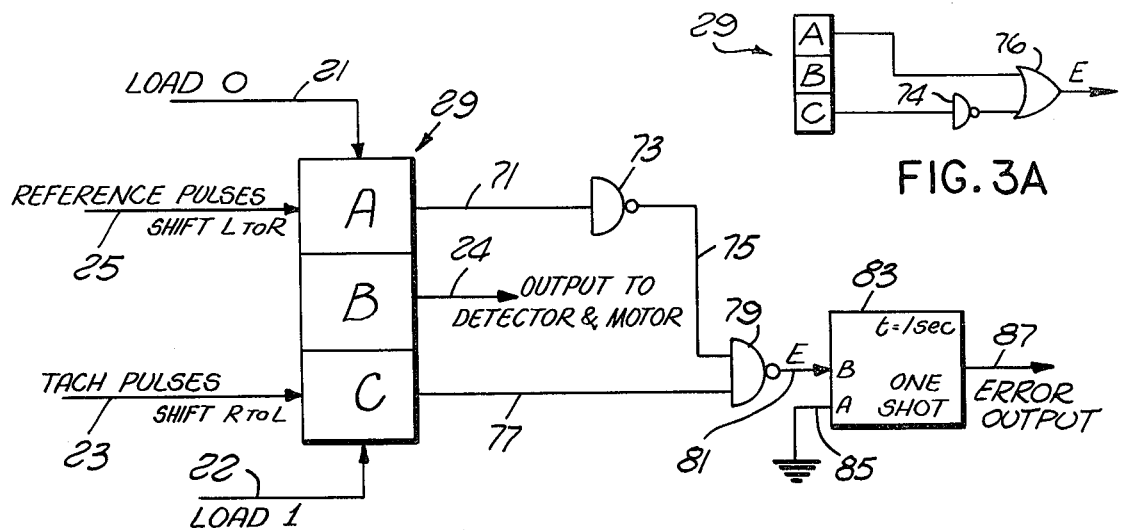
FIG. 3A
FIG. 3
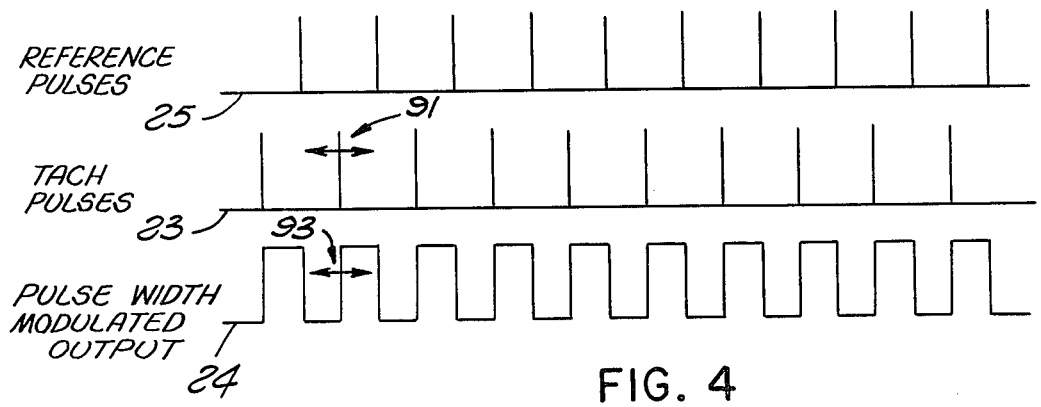
FIG. 4
TRUTH TABLE
| A | B | C | NAND OUTPUT (E) | | A | B | C | NAND OUTPUT (E) | |
|---|---|---|---|---|---|---|---|---|---|
| 0 | 0 | 1 | 0 | | 1 | 1 | 1 | 1 | IMPROPER ORIENTATION |
| 0 | 1 | 1 | 0 | | 0 | 0 | 0 | 1 | |
| 0 | 0 | 1 | 0 | PROPER ORIENTATION | | | | | |
| 0 | 1 | 1 | 0 | | | | | | |
| : | : | : | : | | | | | | |
$$E = \overline{A \cdot C} = \overline{A} + \overline{C}$$
FIG. 5

ERRONEOUS PULSE SEQUENCE DETECTOR

FIELD OF THE INVENTION

This invention relates to the field of drop-out detectors, and in particular to the detection of the erroneous loss or gain of a pulse in either of first and second pulse train signals. The invention is well suited for use with the spindle servo error generator of a videodisc mastering machine.

DESCRIPTION OF THE PRIOR ART

Spindle servo error generators are known in the videodisc art, for use with both videodisc mastering machines and videodisc players. In either case, it is the function of the spindle servo to rotate the disc at a prescribed rate as compared with a reference signal, and when it is determined that the spindle motor is not precisely in step with the reference signal, an error signal is generated to alter the speed of the spindle motor to return it to the desirable speed. Precision control of the servo system in such devices is essential, since the speed of the spindle motor has a direct correspondence to the time base of the video program being recorded or played back.

Accurate time base of the recorded or reproduced program must be maintained in both commonly used videodisc program formatting systems, i.e., the CAV or constant angular velocity format and the CLV or constant linear velocity format. A typical system for rotating a disc at a constant angular velocity and thereby maintaining proper time base is known from copending U.S. patent application Ser. No. 130,901 filed Mar. 17, 1980 by Ceshkovsky et al and entitled "Spindle Servo System for Player". Similarly, a typical spindle servo system for a constant linear velocity format can be found by reference to U.S. Pat. No. 4,228,326 by Dakin et al, issued Oct. 14, 1980. In both systems, an oscillator is used to produce a reference signal (constant for a CAV format and variable for a CLV format), and a servo system is provided for locking the angular velocity of the disc onto the frequency of the reference signal. The servo system typically includes a spindle motor for rotating the disc, an AC tachometer coupled to the motor for producing a signal having a frequency indicative of the angular velocity of the motor, and a phase detector for comparing the tachometer signal with the reference signal and producing a control signal proportional to the difference in their respective phase angles. This control signal is suitably processed in a compensation circuit for producing a prescribed frequency response for the servo and, in turn, amplified and coupled to the spindle motor to appropriately control its angular velocity.

Prior attempts at providing a drop-out detector function for the spindle servo error generator rely on the use of RC based timing circuits to create time windows within which to look for the presence or absence of a reference or tach pulse, as the case may be. Such arrangements provide satisfactory performance in connection with CAV discs, since reference and tach frequencies remain constant throughout the mastering process. However, problems arise in utilizing such RC based circuits in connection with CLV discs. Particularly, the values or R and C can be selected only for a particular frequency in order to provide the optimum window of time for observing the presence or absence of a reference or tach pulse. Accordingly, in the CLV mode of operation, for a particular set of values for R and C of an appropriate RC network, as the disc slows toward the end of the program material, the time constant of the RC network relative to the rotational time period of the disc is substantially decreased, and optimum operation is clearly not possible for all rotational speeds of the disc.

SUMMARY OF THE INVENTION

An improvement to existing time base corrector schemes, i.e., spindle servo control schemes, operates on a pulse width modulation technique for controlling the spindle motor speed. In such an arrangement, rather than to phase compare two AC signals, one from the reference oscillator and one from the tachometer, a three-stage shift register is provided whose output is pulse width modulated by the difference in time relationship between two pulse train inputs, one pulse train representing a reference standard and the other representing the tachometer output. In a preferred embodiment, the standard reference pulses are applied to the first stage of the shift register to shift a zero toward the other end of the register. Simultaneously, the tachometer pulses are applied to the third stage of the shift register and serve to shift a one toward the first stage.

If, for example, the reference pulses and tachometer pulses are separated by precisely half the pulse recurrence time (PRT), 50% duty cycle square wave is produced at the output of the second stage. That is, starting at one point in time, a tach pulse shifts a logical 1 from the third stage to the second stage causing the second stage output to go high. The next reference pulse shifts a 0 from the first stage to the second stage causing the output of the second stage to return to a 0 condition, the output of the second stage therefore remains high for ½ PRT. If the reference pulses and tach pulses are precisely aligned so that the two pulse trains are offset symmetrically, a 50% duty cycle square wave signal will appear at the output of the second stage of the shift register. Thus, when the pulse trains are not symmetrically aligned, as when the spindle motor is not following the reference pulses, the pulse width out of the second stage of the shift register has a duty cycle greater or less than 50%, and this change can be detected by known filtering, compensation, and amplifying means to control the servo mechanism and return the speed of the spindle motor to a value such that the reference and tach pulse trains are again properly aligned. Of course, any predetermined duty cycle could be used as a reference from which spindle motor speed errors are derived, and the 50% duty cycle example just given is merely indicative of the technique used.

When using the shift register technique for controlling the spindle servo as described above, it is necessary to avoid false correcting signals due to an unexpected loss or gain of either a reference pulse or a tachometer pulse. From a practical viewpoint, there is a need to detect and become aware of the loss or gain of either a reference pulse or a tachometer pulse to either disable the spindle servo correcting system or to merely enable an indicator so that an operator will become aware of the malfunction.

It is a primary object of the present invention to provide a method and means for detecting the absence or addition of a pulse in either of first and second pulse train, and in particular to provide a pulse drop-out detector for detecting the absence or addition of a pulse in either the reference pulse train or the tachometer pulse train of a spindle servo system of the shift register type described above. More particularly, an apparatus and method are provided for comparing the outputs of the first and third stages of the shift register of a spindle servo control system, and upon detection that the logical states of the first and third stages of the three-stage shift register are the same, generating a pulse drop-out output signal. Appropriate gating logic elements are provided to accomplish this objective, and, in a preferred embodiment, a one shot multivibrator is enabled by the leading edge of the drop-out error signal so as to create a pulse of longer duration when required by the using device.

Other aspects and advantages of the present invention will become apparent from the following description of the preferred embodiment, taken in conjunction with the accompanying drawings which disclose, by way of example, the principles of the invention.

BRIEF DESCRIPTION OF THE DRAWINGS

FIG. 3 is a detailed block diagram of the pulse drop-out detector according to the present invention;

FIG. 4 is a waveform diagram showing the reference and tachometer pulses and the relationship therebetween to produce the pulse width modulated output for controlling the spindle motor speed;

FIG. 5 is a truth table showing the logical states of the stages of the three-stage shift register of FIG. 3 as well as the NAND output state in both the proper orientation and improper orientation of the reference and tachometer pulses applied to the shift register.

DESCRIPTION OF THE PREFERRED EMBODIMENT

Figure 1:
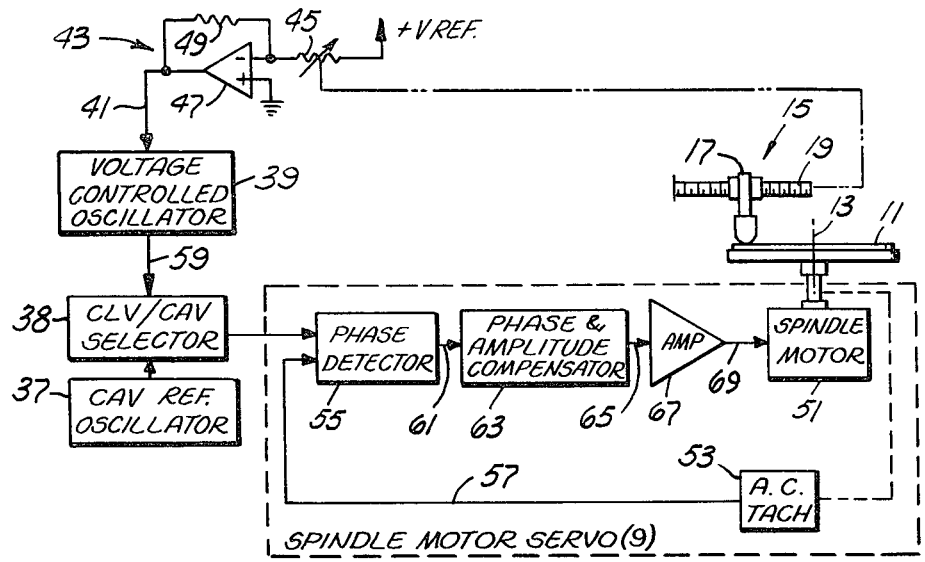
FIG. 1 is a block diagram of a spindle servo system of the prior art using phase detecting techniques for controlling the spindle motor speed.

Referring now to the drawings, and particularly to FIG. 1, there is shown a servo apparatus for rotating an information storage disc 11 about its central axis 13 at a precisely controlled angular velocity. The disc 11 is rotated relative to an optical transducer 15 which operates to record onto the disc information such as conventional color television signal frequency, modulated on a carrier.

The optical transducer 15 includes means for producing a collimated beam of light (not shown) modulated by the information to be recorded, along with a lens carriage 17 which is controllably movable by a lead screw 19 in a radial direction relative to the disc 11 in order to direct the light beam onto a selected portion of the disc as the disc is rotated with respect to it. This produces a series of substantially circular information tracks forming a spiral on the surface of the disc, each track comprising an alternating sequence of light-reflective regions and light-scattering regions as is well known in the art of laser videodisc technology.

The servo apparatus is shown to include means for producing a velocity signal having a frequency corresponding to the desired angular velocity of the information storage disc 11, together with a spindle motor servo 9, responsive to the velocity signal, for controllably rotating the disc at a corresponding angular velocity. In the constant linear velocity mode, as selected by the CLV/CAV selector 38, the velocity signal has an instantaneous frequency substantially inversally proportional to the radius of the information track being recorded, whereby the track is moved at a substantially constant linear velocity relative to the lens carriage 17, and a uniform information recording density over the entire surface of the disc is achieved. When desirable, a constant frequency oscillator, CAV reference oscillator 37, can be selected by selector 38 to effect the servo control of the spindle motor 51. For detailed operation of the CAV and CLV spindle servo systems, reference is again made to the aforementioned U.S. patent application and U.S. patent.

Basically, in the CAV mode, ocillator 37 outputs a constant frequency signal to phase detector 55 which compares the AC output of tachometer 53 representative of the rotational speed of spindle motor 51. Upon detection of a phase difference between the two inputs to detector 55, phase and amplitude compensator 63 creates an output on line 65, amplified by amplifier 67, and applied over line 69 to the spindle motor 51 to correct the spindle motor speed and bring the tachometer output on line 57 in phase with the output of oscillator 37.

Similarly, in the CLV mode, the same analysis applies with the exception that, as lead screw 19 turns to shift the objective lens of lens carriage 17, it also varies the resistance of R45 which when considering the voltage dividing action with resistor 49 and power source V REF is amplified through differential amplifier 47, the arrangement just described and generally indicated at 43 providing a controlling voltage over line 41 proportional to radial distance of the objective lens from the center axis 13 of the disc 11 in order to vary the frequency of voltage controlled oscillator 39. In this manner, as the objective lens increases its radial distance from the disc center, the frequency of voltage controlled oscillator 39 diminishes, and spindle motor 51 servo locks to the constantly changing (lowering) frequency.

Figure 2:
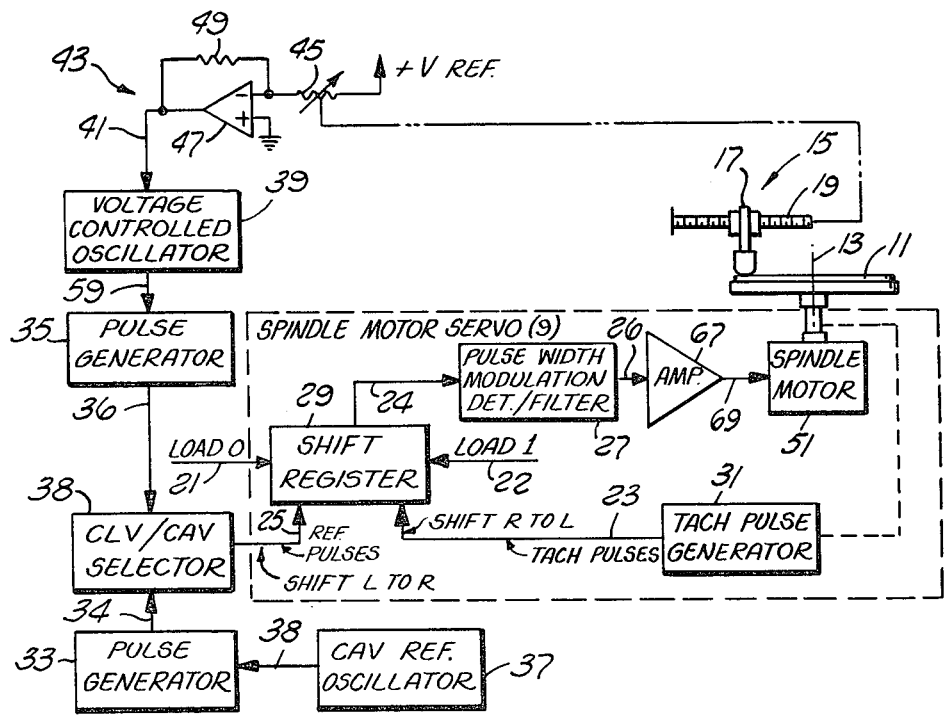
FIG. 2 is an improved version of the spindle servo control circuit of FIG. 1 in which a three-stage shift register and associated reference and tachometer pulses are used for maintaining accurate spindle motor speed in a pulse width modulation detection scheme according to the invention.

In FIG. 2, like components are identified with like reference numerals from FIG. 1 for ease of operational description. Since the basic spindle servo function and operation are similar, only the differences will now be discussed. At the output of either variable voltage controlled oscillator 39 or constant frequency oscillator 37, a pulse generator 35 and 33, respectively, is provided. The pulse generators 35 and 33 each create a pulse train of constant amplitude and short duration pulses selectable by the CLV/CAV selector 38. Similarly, as opposed to an AC tachometer 53 (of FIG. 1), FIG. 2 shows a tachometer pulse generator 31 which outputs a series of tach pulses in a pulse train representative of the spindle motor speed. Assuming, for example, that a single pulse is generated by a pulse generator 31 for each revolution of disc 11, the tach pulses, at least in the center of the disc, would be recurring at a rate of 1800 per minute. Of course, in the CLV mode, as the objective lens is driven toward the outer circumferential position of the disc, the tach pulses and reference pulses will be substantially lower in frequency.

In any event, the reference pulse train on line 25 is, preferably, offset by one-half PRT from the tach pulse train on line 23. Shift register 29 has an input 21 to constantly load a 0 into the first stage of the register, while line 22 constantly loads a 1 into the third stage of the register 29. As explained earlier, as the time relationship between the corresponding pulses of the pair of pulse trains changes, the duty cycle of the output on line 24 from the second stage of the shift register 29 will change to carry the information representative of the time shift between the two pulse trains in the form of a pulse width modulation characteristic. Pulse width modulation detector and filter 27 filters the rectangular wave input on line 24 and outputs a changing DC output on line 26 which is amplified in amplifier 67 and applied over line 69 to spindle motor 51 controlling its rotational speed in the manner described above in connection with FIG. 1. Since the loss or gain of either a reference pulse or a tachometer pulse would be interpreted by the servo system as a gross spindle motor speed error, it is important to monitor the two pulse trains and become aware of any drop-out of pulses in either of the two pulse trains. A loss of a tachometer pulse, for example, could occur with a dirty contact in the mechanism used to produce the tachometer output pulse. The gain of a pulse, for example, could be due to noise induced into the reference or tachometer signal lines. The circuit of FIG. 3 provides a means for indicating the absence or addition of a pulse in either the reference or tachometer pulse trains.

Having reference to FIG. 4, it can be seen that when tach pulse 23 is applied to the shift register 29 of FIG. 3 it serves to shift the 1 loaded into the third stage (C) of shift register 29 to the second stage (B). This is shown in the third line of FIG. 4 where the pulse width modulated output signal 24 goes to the logical 1 state at the occurrence of each tach pulse 23. With the next recurring reference pulse 25 applied to the first stage (A) of shift register 29, a logical 0 is shifted from the first stage to the second stage causing the output of the second stage to fall, and this is indicated in FIG. 4 on the third line coincident with the occurrence of each reference pulse.

For so long as there are no missing or added reference or tachometer pulses, the pulse width modulated output 24 maintains a substantially square wave form as shown in the third line of FIG. 4. When the tachometer pulses begin to vary from the reference pulses, for example when they begin to lead the reference pulses during the recording of a CLV disc, it can be readily observed that the corresponding edge of the output 24 will vary, and this is identified in FIG. 4 by arrows 91 and 93. As a result of the shifting of one of the edges of output 24, the pulse width changes correspondingly, and an error signal is created to drive the spindle motor in the proper direction to alter its speed so as to return the pulse width modulated output 24 to its condition prior to change.

Again, for so long as no reference or tachometer pulses are added or omitted, the second stage of shift register 29 will alternately assume logical 1 and 0 states. If a tachometer pulse is omitted, the result is the occurrence of two reference pulses prior to the next tach pulse, and the left to right shift (i.e., in the direction from A to C) of the 0 loaded into stage A of the shift register will be transferred to the second stage on the first reference pulse and to stage C on the second reference pulse. Accordingly, with the absence of a tachometer pulse, all three states of shift register 29 will be at logical 0. The same analysis can be used when encountering an additional reference pulse, i.e., all three states of shift register 29 will be at logical 0.

In a similar analysis, with the absence of a reference pulse or, alternatively, the addition of an extra tach pulse) the two adjacent tach pulses on line 23 will shift right to left the 1 loaded into stage C such that on the occurrence of the first tach pulse stage B will switch to the 1 state, and on the second tach pulse stage A will switch to a logical 1 as well. In such a condition, all three stages of shift register 29 will be in the logical 1 state.

With this analysis, a truth table can be constructed as shown in FIG. 5 in which the allowable states for the three stages for proper orientation of the tach and reference pulses result in stage A always being at logical 0, stage C always being at logical 1, and stage B alternating between 0 and 1 continuously. Upon the occurrence of a drop-out of a reference pulse, or addition of a tach pulse, register A will attain a logical 1 state, and likewise with the absence of a tach pulse, or addition of a reference pulse register C will attain a logical 0 state, the later two states being considered improper orientation of the reference and tach pulses for lack of one of the pulses, or presence of an additional pulse of one of the pulse trains.

To detect the improper orientation of the two pulse trains, in effect decoding the presence of a logical 1 in register A or the presence of logical $\emptyset$ in register C, the output of stage A of shift register 29 is applied on line 71 to inverter 73. The output of inverter 73 is applied along line 75 to NAND gate 79. The other input to NAND gate 79 is an output from stage C of shift register 29 along line 77. The output of NAND gate 79, on line 81, is thus dependent upon the logical states of stages A and C. With inverter 73 in the path of the output of stage A, it can be appreciated that, in the proper orientation with stage A being a 0 and stage C being a 1, both inputs to NAND gate 79 are 1's, and the output at 81 becomes a logical 0. This is indicated in the upper portion of the truth table of FIG. 5.

Through similar analysis, when an improper orientation is observed, there are two possibilities as shown in the lower truth table of FIG. 5 where the output of both stages A and C are logical 1's or the output of both stages A and C are logical 0's. In either case, one or the other of inputs 75 and 77 of NAND gate 79 will be a logical 0 causing the output 81 to rise to a logical 1 state. Accordingly, the output 81 of NAND gate 79 will remain at 0 for so long as the reference pulses and tachometer pulses are occurring without interruptions and spaced alternately one with the other as shown in FIG. 4. However, upon the occurrence of an absence or addition of one or the other of a reference or tach pulse, the output 81 of NAND gate 79 switches to a 1 level, and this represents the indication that an improper orientation has been detected.

The above detection scheme implements the function $E = \overline{A \cdot C}$, but is not to be limited to it, since its dual $E = \overline{A} + C$ will work equally as well, as one skilled in the art will readily recognize. Reference is made to FIG. 3A for the equivalent logical arrangement. In certain cases, it may be desirable that the error detected be indicated by a pulse of a width shorter than the amount of time that the output of NAND gate 79 normally remains high. For example, with the loss of a single tach pulse, the output of NAND gate 79 would remain high until stage C of the shift register is reloaded with a 1 prior to the occurrence of a normal tach pulse. One shot multivibrator 83 is provided to output a signal of a prescribed duration for further processing. In the example shown in FIG. 3, the output on line 87 representing the error output from one shot 83 is one second in duration.

It will be appreciated that the circuit of FIG. 3 is not frequency sensitive, and hence provides a solution to the problem posed by CLV disc mastering described earlier.

Although the invention has been described in detail with reference to its originally preferred embodiment, it will be understood by one of ordinary skill in the art that various modifications can be made without departing from the spirit and scope of the invention. Accordingly, it is not intended that the invention be limited, except as by the appended claim.

I claim:

1. A method for detecting the absence or addition of a pulse in either of first and second pulse trains, the pulses of the first pulse train alternating, in time, with the pulses of the second pulse train, said method comprising the step of:
    providing a three-stage shift register capable of shifting bidirectionally;
    loading a 0 into the first stage of the shift register;
    loading a 1 into the third stage of the shift register;
    shifting the 0 loaded into said first stage toward said third stage with said first pulse train;
    shifting the 1 loaded into said third stage toward said first stage with said second pulse train;
    detecting the presence of like outputs from said first and third stages, and generating an output error signal when like outputs from said first and third stages are detected.

2. The method as claimed in claim 1, wherein said detecting and generating step includes:
    inverting the output of said first stage and logically NANDing the inverted output so obtained with the output of said third stage.

3. The method as claimed in claim 1, wherein said detecting and generating step includes:
    generating a fixed width pulse coincident with the leading edge of said output error signal.

4. The method as claimed in claim 1, wherein said detecting and generating step includes:
    inverting the output of said third stage and logically ORing the inverted output so obtained with the output of said first stage.

5. A pulse drop-out detector for detecting the absence or addition of a pulse in either of first and second pulse trains, the pulses of the first pulse train alternating, in time, with the pulses of the second pulse train, comprising:
    a three-stage shift register capable of shifting bidirectionally;
    means for loading a 0 into the first stage of said shift register;
    means for loading a 1 into the third stage of said shift register;
    means for shifting the 0 loaded into said first stage toward said third stage with said first pulse train;
    means for shifting the 1 loaded into said third stage toward said first stage with said second pulse train; and
    means for detecting the presence of like outputs from said first and third stages, and for generating an output error signal when like outputs from said first and third stages are detected.

6. The apparatus as claimed in claim 5, wherein said means for detecting and generating includes:
    an inverter for inverting the output of said first stage; and
    a NAND gate for logically NANDing the inverted output so obtained with the output of said third stage.

7. The apparatus as claimd in claim 5, wherein said means for detecting and generating includes:
    pulse generating means for generating a fixed width pulse coincident with the leading edge of said output error signal.

8. The apparatus as claimed in claim 5, wherein said means for detecting and generating includes:
    an inverter for inverting the output of said third stage; and
    an OR gate for logically ORing the inverted output so obtained with the output of said first stage.

* * * * *